(12) United States Patent
Li et al.

(10) Patent No.: US 10,523,126 B1
(45) Date of Patent: Dec. 31, 2019

(54) MULTI-SECTION CURRENT SENSE METHOD FOR MONOLITHIC POWER SYSTEM

(71) Applicant: INNOVISION SEMICONDUCTOR INC, Dongguan (CN)

(72) Inventors: Xuening Li, Dongguan (CN); Guanghua Ye, Dongguan (CN)

(73) Assignee: DONGGUAN CHANGGONG MICROELECTRONICS LTD (CN)

( * ) Notice: Subject to any disclaimer, the term of this patent is extended or adjusted under 35 U.S.C. 154(b) by 0 days.

(21) Appl. No.: 16/228,758

(22) Filed: Dec. 21, 2018

(51) Int. Cl.
*H02M 3/158* (2006.01)
*G01R 19/00* (2006.01)
*G05F 3/26* (2006.01)
*H02M 1/00* (2006.01)
*G05F 1/565* (2006.01)
*H02M 3/156* (2006.01)
*G05F 1/46* (2006.01)

(52) U.S. Cl.
CPC ...... *H02M 3/1584* (2013.01); *G01R 19/0092* (2013.01); *G05F 3/262* (2013.01); *G05F 1/461* (2013.01); *G05F 1/565* (2013.01); *H02M 2001/0009* (2013.01); *H02M 2003/1566* (2013.01)

(58) Field of Classification Search
CPC . G05F 1/461; G05F 1/565; H02M 2003/1566
USPC ................. 323/274–278, 280, 284, 285, 316
See application file for complete search history.

(56) References Cited

U.S. PATENT DOCUMENTS

| | | | |
|---|---|---|---|
| 2005/0219926 A1* | 10/2005 | Tai ...................... | H02M 3/1588 365/207 |
| 2017/0025951 A1* | 1/2017 | Gambetta ............. | H02M 3/158 |
| 2017/0063228 A1* | 3/2017 | Kimura ................ | H02M 3/158 |
| 2017/0182894 A1* | 6/2017 | Yamaguchi ......... | H02M 3/1582 |
| 2017/0187278 A1* | 6/2017 | Yamaguchi ........... | H02M 1/088 |

* cited by examiner

*Primary Examiner* — Gary A Nash
(74) *Attorney, Agent, or Firm* — Mark Luo

(57) ABSTRACT

This present invention comprises the multiple power sections and a multi-input operational amplifier, wherein the pilot device places at the different location of the main power MOSFET form multiple individual power section, the multi-input operational amplifier drives a transistor to detect the overall current of each power section furthermore report the overall current to system.

2 Claims, 5 Drawing Sheets

MULTI-SECTION CURRENT SENSE METHOD FOR MONOLITHIC POWER SYSTEM

TECHNICAL FIELD

The present disclosure relates to a power semiconductor device and applied power electronics circuits, and more particularly on how to accurately sense the current in a power semiconductor device.

BACKGROUND

A power supply or a voltage regulator (VR) is widely used in various electronic systems to provide a constant voltage level and a current required by a load. Moreover, modern electronic system may include components that maintain current requirements across a broad range, from relatively high peak currents to very low currents in light load operation mode. In all the power supply and converter designs, one of key techniques is how to accurately and timely acquire current signal that will be used for current control and monitoring purpose.

For a hypothetical server system for example, an ever increasing accuracy of current-sense (CS) and power telemetry data are required to be used in system level power and thermal management algorithms. For example, the central processing unit (CPU) power management algorithms need load current information from the CPU Voltage Regulator. CPU load current information is used to optimize CPU performance versus Running Average Power Limit (RAPL) control while still maintaining safe operation of the system. Accuracy of current sense directly impacts system performance, reliability, and power saving. Therefore, tighter current-sense accuracy targets are expected for a next generation of servers. ±2% current-sense accuracy specification may be a future trend for a wide load operation range. However, attaining such accuracy to improve system performance using generally-known techniques introduce either extra power loss or additional cost for a power processing unit in an electronic system.

Conventionally, a relatively accurate current-sense can be achieved by using a dedicated sense resistor in series to the output inductor. However this traditional method would introduce quite a bit of extra power loss, especially for high output current applications.

To minimize unnecessary power loss on current sensing, an inductor direct current resistance (DCR) sensing scheme is widely adopted in the industry. Inductor DCR Current Sensing uses the voltage drop on the output inductor DC Resistance (DCR) to derive the output current information. Although the DCR based sensing scheme is lossless, it's difficult to meet the ever increasing current-sense accuracy requirement for existing and future applications. The DCR-based current sense accuracy is also impacted by DCR tolerance, time constant mismatch, printed circuit board (PCB) assembly process and undesired temperature compensation.

An alternative way may be to use MOSFET RDS (on) based current sense technique. The metal oxide-semiconductor-field-effect-transistors (MOSFET) is a critical component being widely used in a power converter or a VR, and RDS (on) is referred to as drain-to-source resistance in an on-state for a MOSFET device. RDS (on) based current sense method has been widely adopted since it does not need extra sense components and external time constant match. However, the RDS (on) based current sense accuracy is significantly impacted by the tolerance (usually 20-40%) of the MOSFET on-state resistance ($R_{DS\ (ON)}$) from a MOSFET component to another, and a difficult temperature compensation implementation.

Another alternative way may be to use the "mirror FET" or "pilot device" to proportionally sense the current flowing through a main power device such as a MOSFET. An accurate current-sense in a full load operation range may be potentially achieved by pilot device based current sense method. Current sense accuracy will no longer be impacted by silicon process variation, and temperature compensation will no longer be needed since the pilot device is from same, one die; and thus, it should best represent operation of the main power device. Pilot device based current sense method is theoretically the best approach suited to modern monolithic design of power MOSFET.

For the monolithic power MOSFET, for example, in a synchronous Buck converter or the power stage, the power MOSFET is laid out as the millions of cells connected in parallel by the metal layers. The current flowing through the main MOSFET is sensed by the pilot device that may be one cell or several cells of the same main device, which is normally located at the center of the main MOSFET. The pilot device has the same gate and source voltage as that of the main device; the drain of the pilot device enforces a current to make the same drain voltage as that of the main MOSFET. Therefore, the current flowing through the pilot device proportionally represents the current flowing through the main field effect transistor (FET). The current ratio of the pilot device versus the main MOSFET device is proportional to the geometric ratio of pilot device versus the main device. This is true for the small size, low power MOSFET in which the main power MOSFET has the uniform current distribution.

However, for the high-current high-power application, the MOSFET area become so big. As such, the current flow is no longer uniform at the different location of the silicon due to non-identical metal resistance of each cell of the main MOSFET and the current flowing direction on a specific application PCB. The current non-uniformity also depends on the local temperature of the cells in the silicon. Current sense accuracy has to be compromised if the pilot device is placed at the one location, for an example of center of main the MOSFET.

This invention proposes a method to use multi-cell pilot devices and put the pilot device at the different locations of the main MOSFET. So the big size main power MOSFET is separated into many sections and each section has its own pilot device to match the location and temperature. In the meantime, in order to deal with the multi-pilot devices, a multi-input amplifier stage is invented as a pre-stage for the amplifier to sum the current information of the multi-cell pilot devices.

In one or more embodiment, the present innovation provides a current sense scheme for MOSFET RDS (on) sense based voltage regulator (VR). Same concept or method may be used in a power stage device or power processing unit in an electronic system.

SUMMARY

Embodiments of the present invention is directed to a method of accurate current sense circuit for monolithic power system. A switching converter includes a power stage having a high side main power MOSFET, which coupled between input voltage and switching node, and a low side main power MOSFET coupled between switching node and ground. The switching converter also includes a current sense circuit which coupled with two or more power sections. The current sense circuit includes a multi-input operational amplifier, a transistor, a current mirror and parasitic metal resistors.

The method further includes two or more power sections to detect the current flowing in each power section. Each power section comprises a main power MOSFET, a pilot MOSFET, and a nature MOSFET.

The method further includes a multi-input operational amplifier, which collects the all of power section current information to report out.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
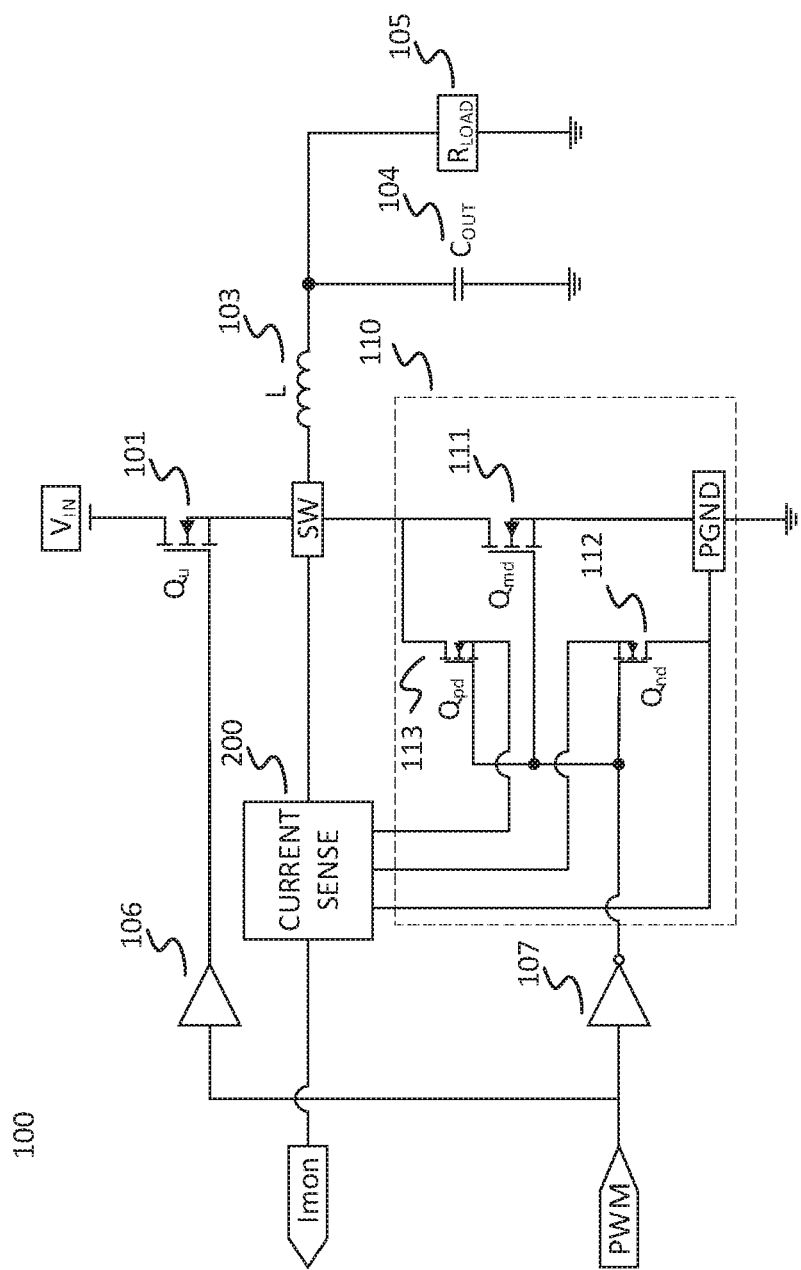
FIG. 1 illustrates a block diagram of power stage of buck converter, in accordance with certain embodiments of the present disclosure.

FIG. 1 illustrates an exemplary Buck converter with current mirror sense methodology. Buck converter 100 comprises a high side main power MOSFET $Q_u$ 101, a low side main power MOSFET $Q_{md}$ 111, an output inductor L 103, and output capacitor $C_{OUT}$ 104. The main power MOSFET is laid out as the millions of cells connected in parallel by the metal layers. The current flowing through the main power MOSFET $Q_{md}$ 111 is sensed by the pilot MOSFET $Q_{pd}$ 112, which is one cell or several cells of the main device that is normally located at the center of the main power MOSFET $Q_{md}$ 111. The pilot MOSFET $Q_{pd}$ 112 has the same gate and source voltage as that of main power MOSFET $Q_{md}$ 111, the drain of the pilot MOSFET $Q_{pd}$ 112 is applied a current by current sense circuit 200 to make the same drain voltage as that of the main power MOSFET $Q_{md}$ 111. Therefore the current flowing through the pilot MOSFET $Q_{pd}$ 112 represents the current flowing through the main power MOSFET $Q_{md}$ 111. Ideally, the current ratio of the pilot MOSFET $Q_{pd}$ 112 and the main power MOSFET $Q_{md}$ 111 has the same geometric ratio K of pilot MOSFET $Q_{pd}$ 112 and the main power MOSFET $Q_{md}$ 111.

Ideally, it is true for the small size power MOSFET, in which the main power MOSFET $Q_{md}$ 111 has the uniform current distribution among cells. However, for the high current application, the main power MOSFET $Q_{md}$ 111 area is so big that it causes the current flow to no longer be uniform at the different locations of silicon due to non-identical metal resistance for each cell of the main power MOSFET $Q_{md}$ 111 and the current flowing direction of entering main power MOSFET $Q_{md}$ 111. The current non-uniformity also depends on the local temperature of the cells in the silicon. To place the pilot MOSFET $Q_{pd}$ 112 at the center local of the main power MOSFET $Q_{md}$ 111 does not meet the current sense accuracy.

Figure 2:
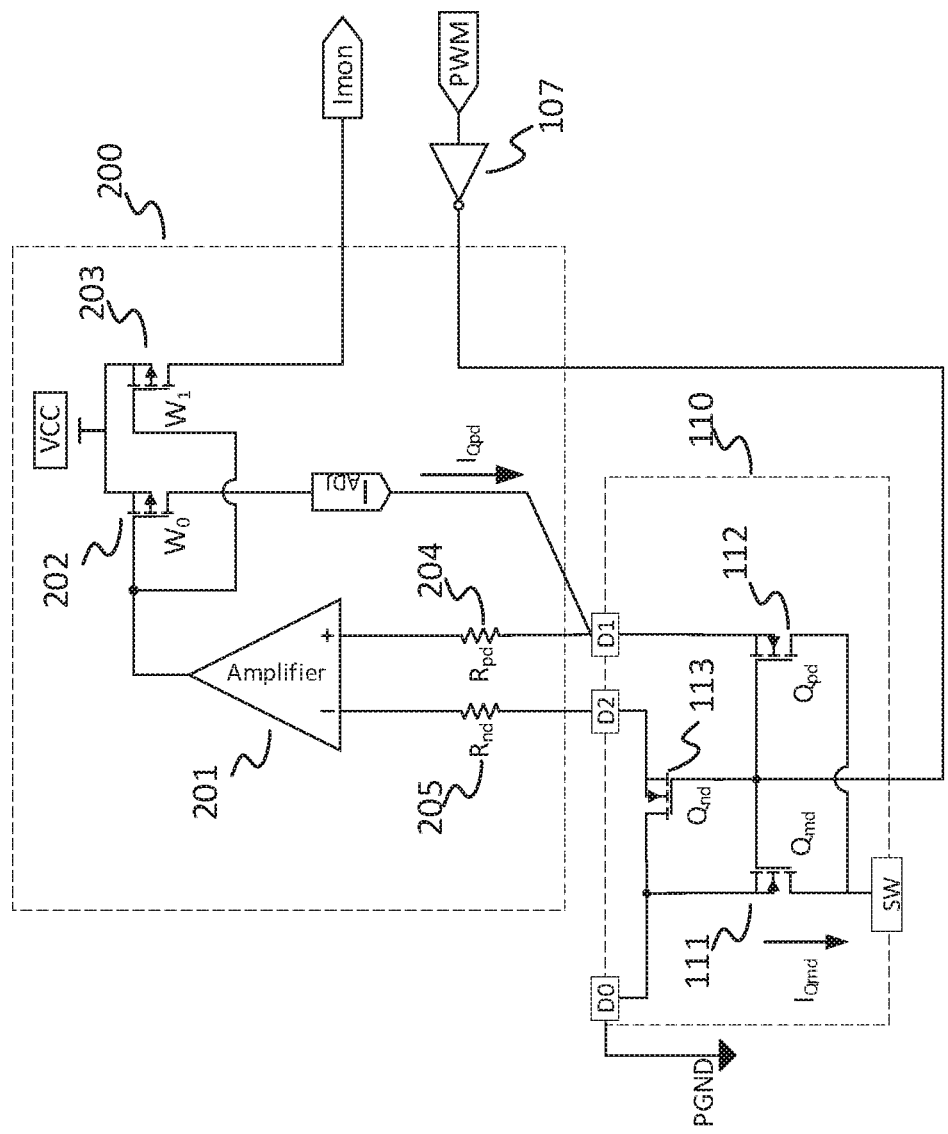
FIG. 2 illustrates a circuit diagram of the a prior art generalized current sensing circuit.

FIG. 2 illustrates a prior art of current sense circuit 200. The main power MOSFET $Q_{md}$ 111 and the pilot MOSFET $Q_{pd}$ 112 has the same gate and source voltage. The operational amplifier 201, transistor $W_0$ 202, pilot MOSFET $Q_{pd}$ 112, and metal trace resistor $R_{pd}$ 204 form a closed loop to force the same voltage on node D0 and D1. Therefore, the ratio of the current flowing through the main power MOSFET $Q_{md}$ 111 and pilot MOSFET $Q_{pd}$ 112 is determined by the device geometry ratio of the two MOSFETs. Where the $R_{sp}$ is the specific on-resistance of the MOSFET and defined as Ron*Area, the $W_{Qmd}$ is the total channel width of the main power MOSFET $Q_{md}$ 111.

The current flowing through the main power MOSFET $Q_{md}$ 111 is:

$$I_{Qmd} = \frac{V_{SW}}{R_{sp}} \times W_{Qmd} / L_{pitch}, \quad (1)$$

and the current flowing through the pilot MOSFET $Q_{pd}$ 112 is:

$$I_{Qpd} = \frac{V_{SW}}{R_{sp}} \times W_{Qpd} / L_{pitch} \quad (2)$$

where the $W_{Qpd}$ is the total channel width of the pilot MOSFET $Q_{pd}$. From equation (1) and (2):

$$\frac{I_{Qmd}}{I_{Qpd}} = \frac{W_{Qmd}}{W_{Qpd}} = K \quad (3)$$

where K is the channel width ratio between the main power MOSFET $Q_{md}$ 111 and the pilot MOSFET.

Figure 3:
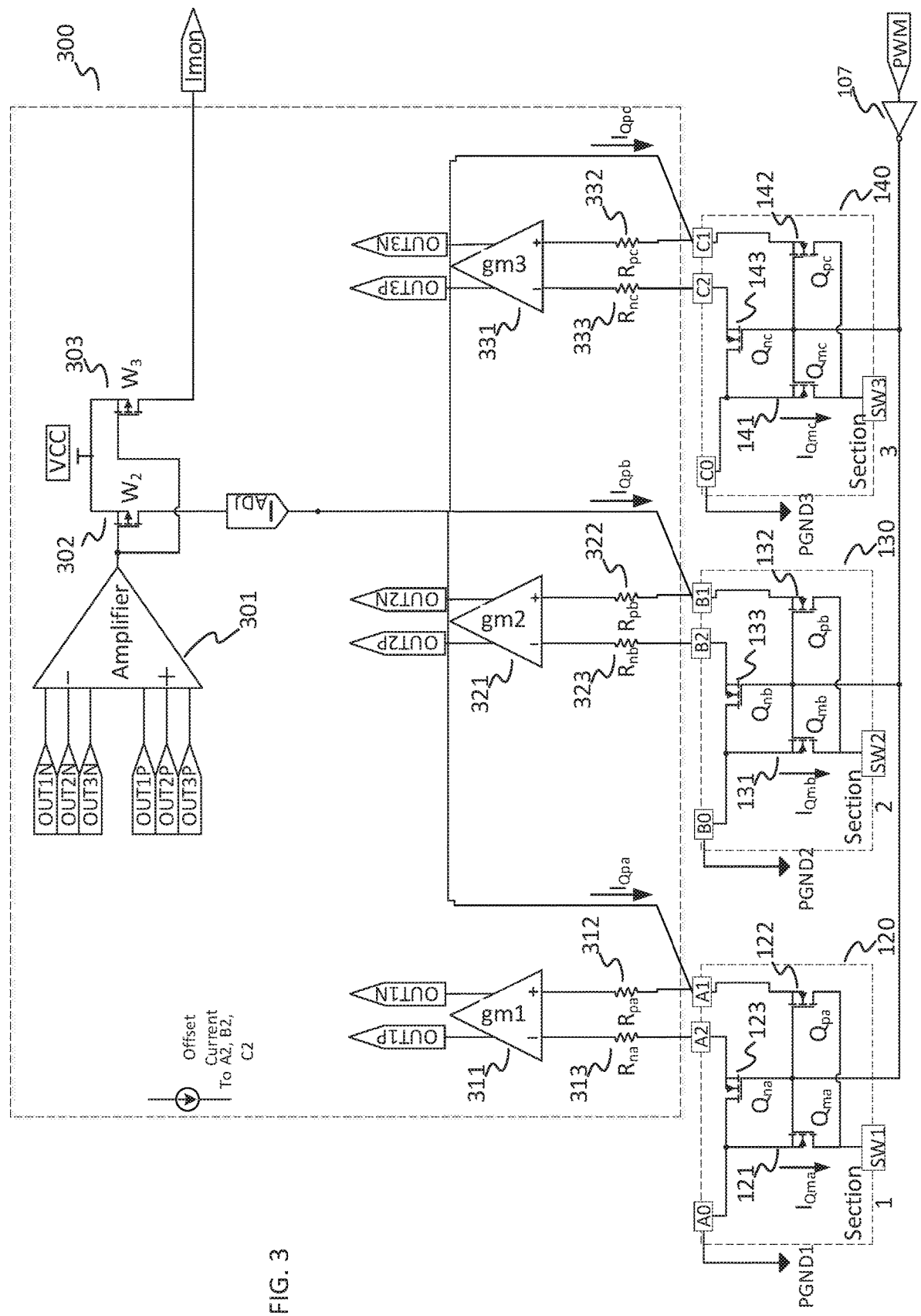
FIG. 3 illustrates a current sensing circuit diagram, in accordance with certain embodiments of the present disclosure.

FIG. 3 illustrates a current sense circuit 300 and three sections of MOSFET for according to an embodiment of the present invention. In one embodiment, current sense circuit 300 comprises three transconductor gm1 311, gm2 321, gm3 323, three pair metal parasitic resistor $R_{pa}$ 312, $R_{na}$ 313, $R_{pb}$ 322, $R_{nb}$ 323, $R_{pc}$ 332, $R_{nc}$ 333, a multi-input operational amplifier 301, a transistor $W_2$, and a transistor $W_3$. Each section of the three sections of MOSFET comprises the main power MOSFET $Q_{ma}$ 121, $Q_{mb}$ 131, $Q_{mc}$ 141, the pilot MOSFET $Q_{pa}$ 122, $Q_{pb}$ 132, $Q_{pc}$ 142 and nature device $Q_{na}$ 123, $Q_{nb}$ 133, $Q_{nc}$ 143. Each section has the pilot MOSFET $Q_{pa}$ 122, $Q_{pb}$ 132, $Q_{pc}$ 142 to keep local match the main power MOSFET $Q_{ma}$ 121, $Q_{mb}$ 130, $Q_{mc}$ 140 for the geometry size and the temperature. The MOSFET in each power section is controlled by a complementary PWM signal through the output of inverter 107. Thus when the PWM signal is low, the output of inverter 117 is high that turns on the all of MOSFETs in each section.

Those three gm transconductor gm1 311, gm2 321, gm3 323 and six input operational amplifier and a transistor $W_0$ form a loop, the following equation is true:

$$V_{A1} + V_{B1} + V_{C1} = V_{A2} + V_{B2} + V_{C2} \quad (4)$$

where the $V_{A1}$ is the voltage drop from node A1 to ground, $V_{B1}$ is the voltage drop from node B1 to ground, $V_{C1}$ is the voltage drop from node C1 to ground, $V_{A2}$ is the voltage drop from node A2 to ground, $V_{B2}$ is the voltage drop from node B2 to ground, and $V_{C2}$ is the voltage drop from node C2 to ground.

Since $V_{A0}=V_{A2}$, $V_{B0}=V_{B2}$, and $V_{C0}=V_{C2}$, where the $V_{A0}$ is the voltage drop from node A0 to ground, $V_{B0}$ is the voltage drop from node B0 to ground, $V_{C0}$ is the voltage drop from node C0 to ground, thus $$(V_{A1}-V_{A0})+(V_{B1}-V_{B0})+(V_{C1}-V_{C0})=0 \quad (5)$$

The output of current sense circuit is the current monitor $I_{mon}$ is expressed:

$$I_{mon}=I_{Qpa}+I_{Qpb}+I_{Qpc} \quad (6)$$

where the $$I_{Qpa} = \frac{I_{Qma}}{K} + \frac{(V_{A1} - V_{A0})}{K \times R_{onQma}}, \quad (7)$$

$$I_{Qpb} = \frac{I_{Qmb}}{K} + \frac{(V_{B1} - V_{B0})}{K \times R_{onQmb}},$$

$$I_{Qpc} = \frac{I_{Qmc}}{K} + \frac{(V_{C1} - V_{C0})}{K \times R_{onQmc}},$$

and the $R_{onQma}$, $R_{onQmb}$ and $R_{onQmc}$ are the equivalent on resistance of the main power MOSFET $Q_{ma}$ 121, $Q_{mb}$ 131, $Q_{mc}$ 141, respectively.

Substitute (6) with (7) and total current I is the summation of $I_{Qma}$, $I_{Qmb}$ and $I_{Qmc}$ which can be expressed:

$$I_{mon} = \frac{I}{K} + \frac{(V_{A1} - V_{A0})}{K \times R_{onQma}} + \frac{(V_{B1} - V_{B0})}{K \times R_{onQmb}} + \frac{(V_{C1} - V_{C0})}{K \times R_{onQmc}} \quad (8)$$

The resistance of $R_{onQma}$, $R_{onQmb}$ and $R_{onQmc}$ are equal in equation (8), and combined with equation (5), then $$I_{mon} = \frac{I}{K} \quad (9)$$

Equation (9) shows the monitor current $I_{mon}$ is proportional to the total main power MOSFET current I. The current ratio is determined by the device geometry size ratio of the devices and it is K.

Figure 4:
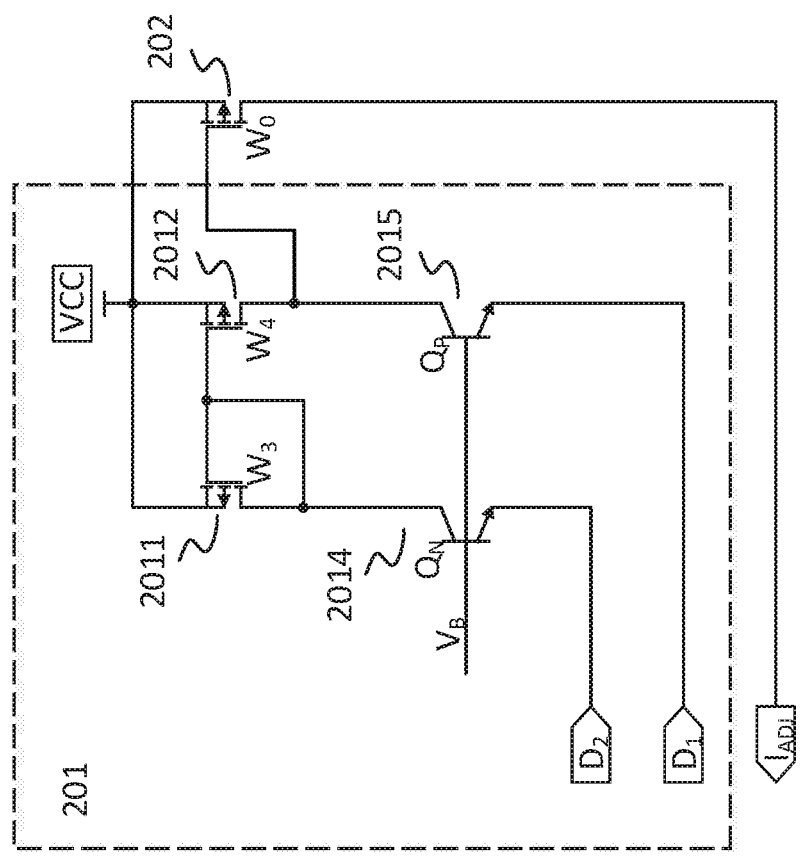
FIG. 4 illustrates a circuit diagram of prior art operational amplifier.

FIG. 4 is a circuit diagram of a traditional common base input operational amplifier configuration 201. As seen in FIG. 4, that a pair transistor $Q_N$ 2014 and $Q_P$ 2015 are the input of operational amplifier. The output of operational amplifier 201 is coupled with a transistor $W_0$ 202 to drive a current through the transistor $W_0$ 202 for forcing the voltage of pilot MOSFET and main power MOSFET are equal.

Figure 5:
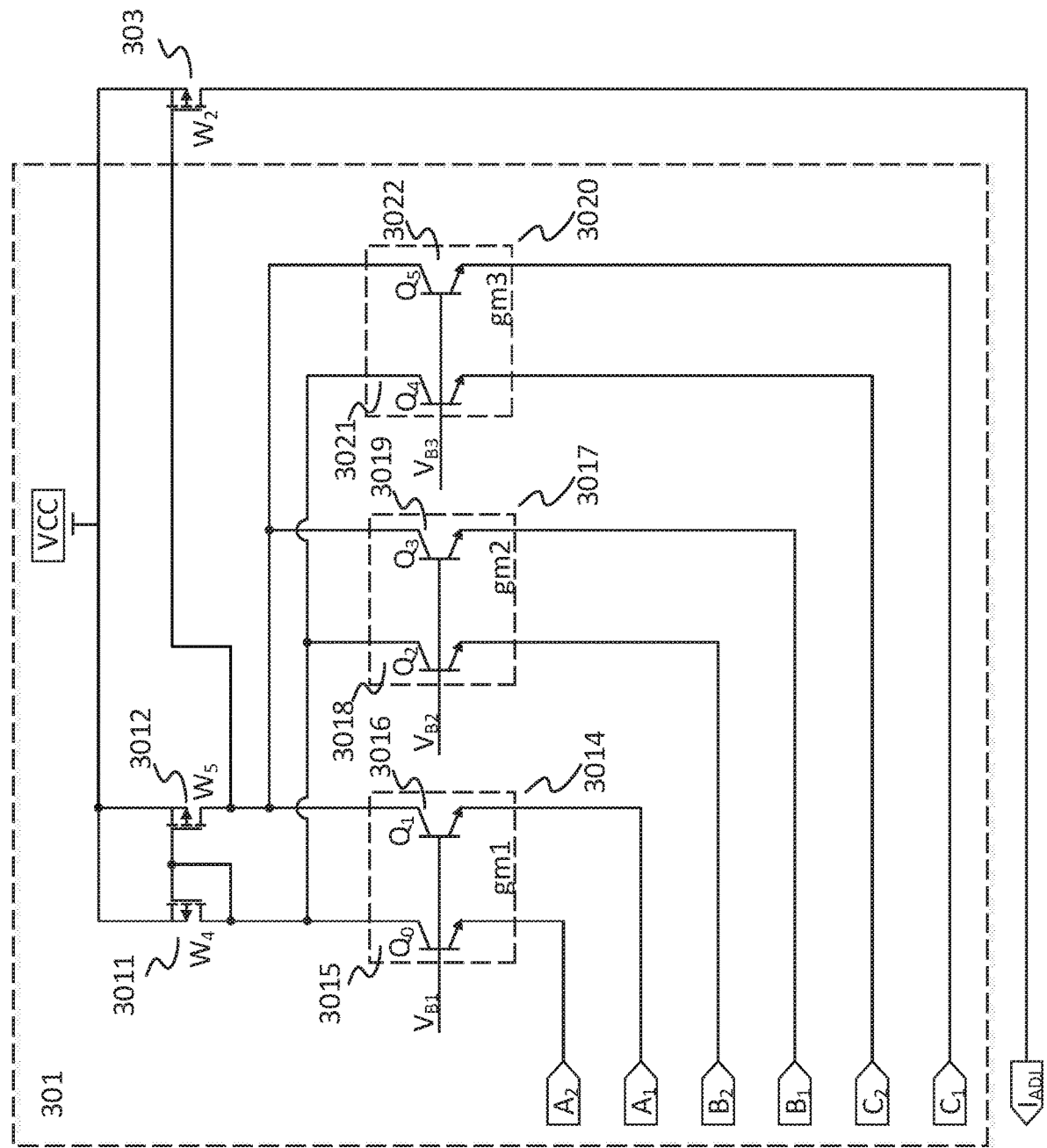
FIG. 5 illustrates a circuit diagram of multi-input operational amplifier, in accordance with certain embodiments of the present disclosure.

Referring to FIG. 5, the multi-input operational amplifier of the present invention compares two or more pairs transistors $Q_0$ 3015, $Q_1$ 3016, $Q_2$ 3018, $Q_3$ 3019, $Q_4$ 3021, $Q_5$ 3022 as the input of operational amplifier. For purposes of clarification, the entire element of multi-input operational amplifier are not shown on. The disclosure embodiment of the present invention further comprises two transistors $W_4$ 3011 and $W_5$ 3012.

The exemplary embodiments were chosen and described in order to better explain the principles of the invention and the most possible practical application, and to help peers with ordinary skill in the art to understand the disclosure for various embodiments with possible modifications. Various changes in an actual implementation may be made although above exemplary embodiments have been used. In addition, many modifications may be made to adapt a specific application or a particular system, to the teachings of the disclosure without departing from the essential scope thereof. Therefore, the disclosure not be limited to the exemplary embodiments disclosed for implementing this disclosure. Moreover, all of derived or evolved embodiments be covered within the scope of the appended claims. In addition, the reference, definition, and terminology used herein are for the purpose of describing specific embodiments only and are not intended to be limiting of the disclosure.

What is claimed is:

1. A switching converter, comprising:
   a high side main power MOSFET coupled between input voltage and a switching node;
   an output inductor coupled between the switching node and output voltage;
   two or more current sense sections to detect each section current, including:
      a main power MOSFET coupled between the switching node and ground;
      a pilot MOSFET coupled between the switching node and an input of current sense circuit;
      a nature MOSFET coupled between the ground and the input of current sense circuit
   two or more current sense circuit to force the each power section has the same current, including:
      one or more transconductor coupled with the parasitic metal resistance;
      one or more multi-input operational amplifier, wherein the multi-input operational amplifier further comprises two or more transconductor at input end and drives the current mirror transistors current to each power section to determine each power section current;
      one or more current mirror circuit;
      one or more current monitor circuit.

2. A switching converter, comprising:
   a high side main power MOSFET coupled between input voltage and a switching node;
   an output inductor coupled between the switching node and output voltage;
   two or more current sense sections to detect each section current, including:
      a main power MOSFET coupled between the switching node and ground;
      a pilot MOSFET coupled between the switching node and an input of current sense circuit;
      a nature MOSFET coupled between the ground and the input of current sense circuit
   two or more current sense circuit to force the each power section has the same current, including:
      one or more transconductor coupled with the parasitic metal resistance;
      one or more multi-input operational amplifier;
      one or more current mirror circuit, wherein the current mirror circuit is driven by operational amplifier to provide the overall current information;
      one or more current monitor circuit.

\* \* \* \* \*